United States Patent
Luo et al.

(10) Patent No.: US 7,530,388 B2
(45) Date of Patent: May 12, 2009

(54) HEAT SINK

(75) Inventors: Jun Luo, Shenzhen (CN); Cui-Jun Lu, Shenzhen (CN); Chin-Lung Chen, Taipei Hsien (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/759,052

(22) Filed: Jun. 6, 2007

(65) Prior Publication Data

US 2008/0302506 A1 Dec. 11, 2008

(51) Int. Cl.
*F28F 7/00* (2006.01)
*H05K 7/20* (2006.01)

(52) U.S. Cl. .................... 165/80.3; 165/185
(58) Field of Classification Search ............... 165/80.3, 165/185, 104.34, 78; 361/697, 703, 704, 361/709, 710; 257/16.3
See application file for complete search history.

(56) References Cited

U.S. PATENT DOCUMENTS

| | | | | |
|---|---|---|---|---|
| 4,669,535 A | * | 6/1987 | Seidler | 165/78 |
| 5,419,041 A | * | 5/1995 | Ozeki | 29/890.03 |
| 6,076,594 A | * | 6/2000 | Kuo | 165/80.3 |
| 6,474,407 B1 | | 11/2002 | Chang et al. | |
| 6,607,023 B2 | * | 8/2003 | Ho et al. | 165/78 |
| 6,644,386 B1 | | 11/2003 | Chang et al. | |
| 6,651,733 B1 | * | 11/2003 | Horng et al. | 165/80.3 |
| 6,672,379 B1 | * | 1/2004 | Wang et al. | 165/185 |
| 6,859,367 B2 | * | 2/2005 | Davison | 361/704 |
| 7,032,650 B1 | * | 4/2006 | Tian | 165/80.3 |
| 7,284,597 B2 | * | 10/2007 | Tang | 165/80.3 |
| 2003/0116304 A1 | * | 6/2003 | Ho et al. | 165/80.3 |
| 2005/0115702 A1 | * | 6/2005 | Lin et al. | 165/185 |

\* cited by examiner

*Primary Examiner*—Tho v Duong
(74) *Attorney, Agent, or Firm*—Frank R. Niranjan

(57) ABSTRACT

A heat sink includes first and second fin sets. The first fin set includes a plurality of fins each having a flange extending perpendicularly from an edge thereof and oriented in a same first direction. The flanges engage with each other in succession through locking parts formed thereon. The second fin set includes a plurality of fins each having a flange extending perpendicularly from an edge thereof and oriented in a same second direction toward the first direction. The flanges engage of the second fins with each other in succession through locking parts formed thereon. One of the flanges of an outmost one of the fins of the first fin set and one of the flanges of an outmost one of the fins of the second fin set are extended toward to and engaged with each other.

12 Claims, 5 Drawing Sheets

HEAT SINK

BACKGROUND OF THE INVENTION

1. Field of the Invention

The present invention relates generally to a heat sink, and more particularly to a heat sink comprising a plurality of individual fins assembled together for removing heat from a heat-generating electronic component to ambient environment.

2. Description of Related Art

Heat sinks are usually used to remove heat from heat-generating electronic components, such as central processing units (CPUs), power transistors, etc., to keep the components in stable operation. A typical heat sink comprises a base for contacting a heat-generating component to absorb heat generated by the heat-generating component and a plurality of parallel planar fins attached to the base by soldering or adhering. The fins are used for dissipating the heat to the ambient environment.

Typically, the heat sink is a parallel fin heat sink, which is fabricated by processes including an extrusion process, a gang sawing process and a bonding process. It is known that thickness and number of the fins produced by the extrusion process is restricted by the structure limitation and stress loading limitation of a die. If the number of the fins increases, the die fingers become weaker thus easily break off. Therefore, the extrusion process is not suitable for fabricating the high-density fin heat sink. The gang sawing process is performed by cutting off portions of a metal block to produce fins having predetermined thickness, number, depth and gap, which result in a great loss of material. In the bonding process, each fin is individually bonded into a base of the heat sink, which is time-consuming and labor intensive. In addiction, the fins that are not well-bonded into the base are likely to fall and thus be detached from the base.

A current thermal resolution to overcome the problems mentioned above is to provide a composite fin unit having a plurality of individual fins assembled together. The fins each have at least a flange extending perpendicularly from at least an edge thereof. Each flange of the fins is provided with a locking structure thereon. The locking structure of each fin engages with the locking structures of the rear and front fins to assemble the fins together with their flanges oriented in a same direction. The density of the fins can be predetermined by width of the flanges and able to be increased dramatically. However, the flanges of the fins are oriented in the same direction, one of the outmost fins would have its flange projecting nakedly from the fin unit. The naked flange is in a risk of damaging components surrounding the heat-generating component and hurting an operator during installation.

What is needed is a heat sink which has a plurality of individual fins assembled together to obtain a fin unit which has a high density of fins and is safe in installation and use.

SUMMARY OF THE INVENTION

A heat sink adapted for removing heat from a heat-generating component, includes a first fin set and a second fin set. The first fin set includes a plurality of fins, each of the fins having a flange extending perpendicularly from an edge thereof and oriented in a same first direction, the flanges engaging with each other in succession through locking parts formed thereon. The second fin set includes a plurality of fins, each of the fins having a flange extending perpendicularly from an edge thereof and oriented in a same second direction toward the first direction, the flanges engaging with each other in succession through locking parts formed thereon. One of the flanges of an outmost one of the fins of the first fin set and one of the flanges of an outmost one of the fins of the second fin set are extended toward and engaged with each other. Accordingly, none the flanges of the fins of heat sink has a sharp edge which is exposed outwardly, which may cut and hurt an operator's hands when the operator mounts the heat sink to a printed circuit board.

Other advantages and novel features will become more apparent from the following detailed description of preferred embodiment when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
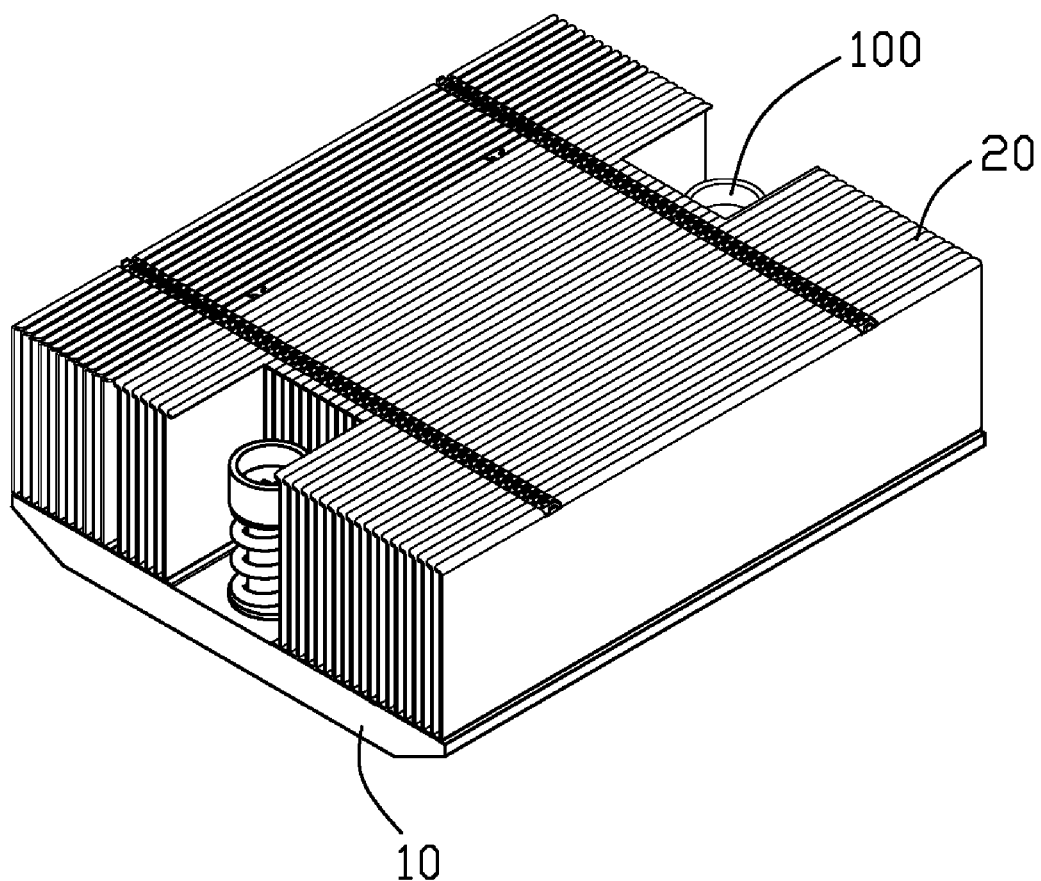
FIG. 1 is an assembled view of a heat sink of a preferred embodiment in accordance with the present invention.
Figure 2:
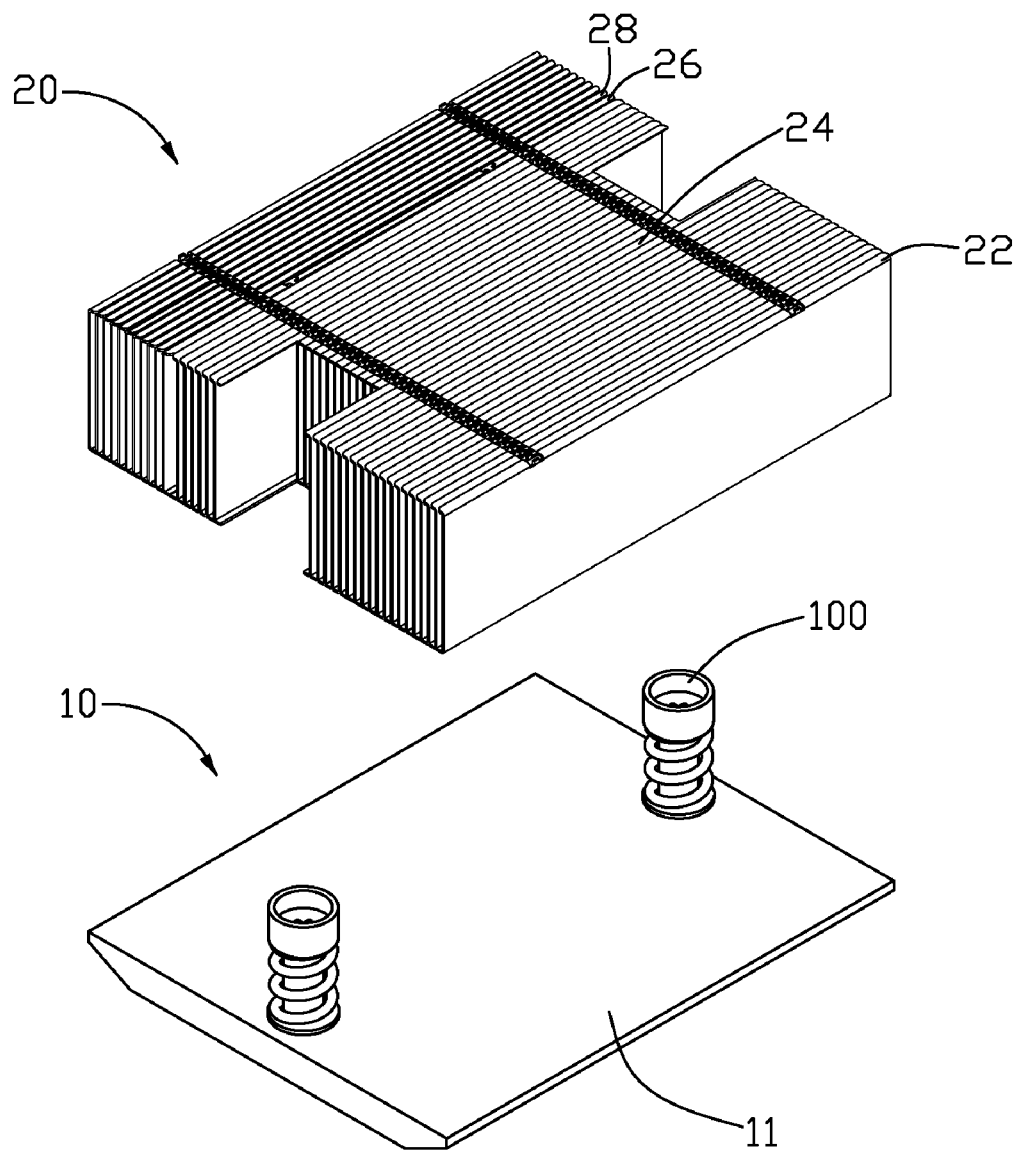
FIG. 2 is a partially exploded view of FIG. 1.
Figure 3:
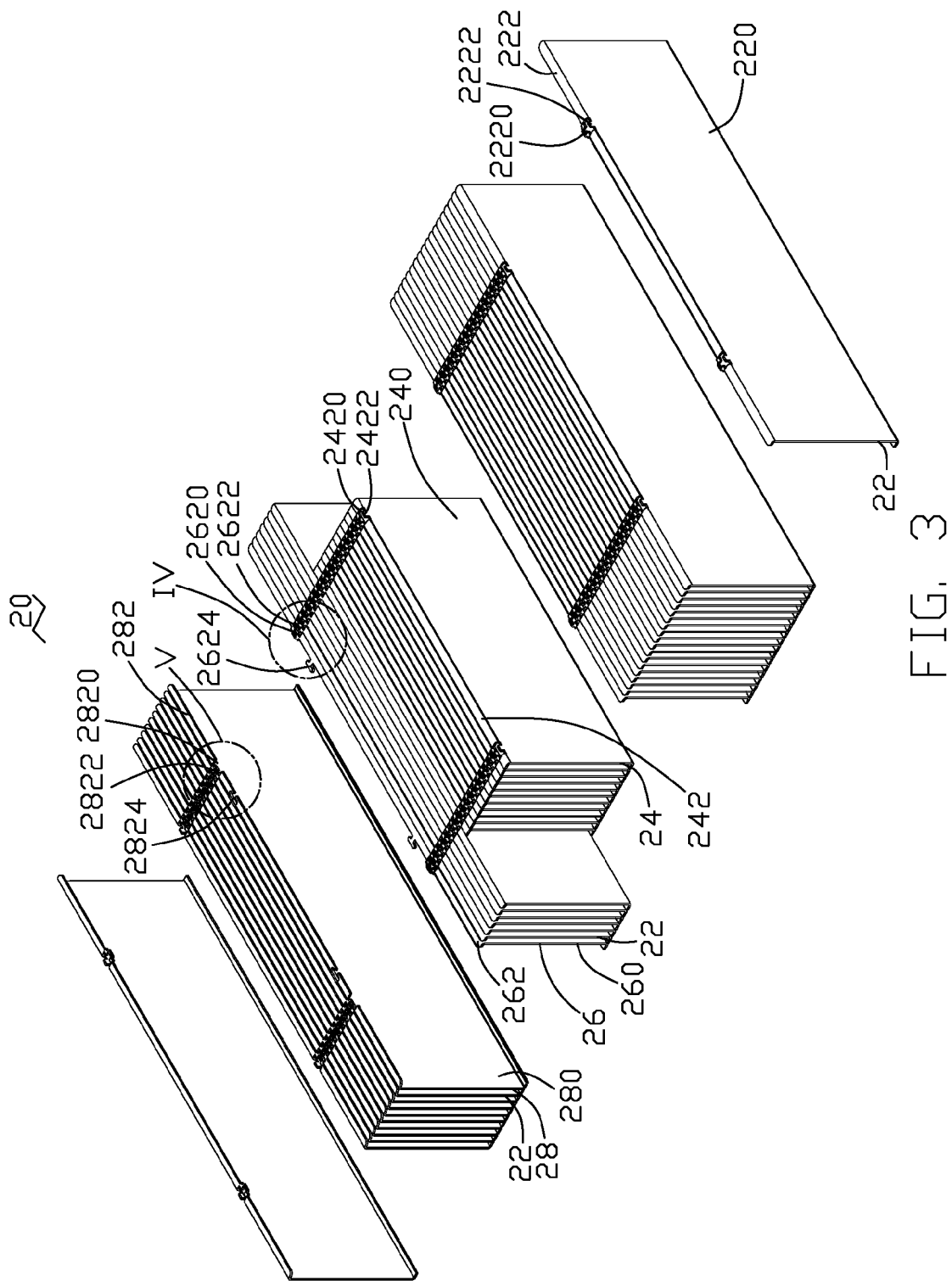
FIG. 3 is an exploded view of a fin unit of the heat sink of FIG. 2.

Referring to FIGS. 1-3, a heat sink in accordance with a preferred embodiment of the present invention is adapted for removing heat form a heat-generating component (not shown) mounted on a printed circuit board (not shown). The heat sink comprises a base 10 and a fin unit 20 including a plurality of individual fins vertically standing on the base 10.

The base 10 is made of a material having a high thermal conductivity, such as aluminum or copper, and has a rectangular plate body 11 having a bottom surface for absorbing heat from the heat-generating component and a top surface supporting the fin unit 20 thereon. The base 10 is provided with two fixtures 100 mounted adjacent to two opposite edges of a middle portion of the plate body 11, for securing the heat sink to the printed circuit board.

Please referring to FIG. 3 particularly, the fin unit 20 comprises a plurality of first fins 22, a plurality of second fins 24, a third fin 26 and a fourth fin 28 matching with the third fin 26. All of the fins 22, 24, 26 28 of the fin unit 20 are made of rectangular, thin metallic plates, and identical to each other in height. The first fins 22 are located at two opposite sides of the second fins 24. The second fins 24 are located at middle of the fin unit 20 and similar to the first fins 22 in structure, excepts having a length less than that of the first fins 22 for forming two recesses at two lateral sides of the middle of the fin unit 20 to accommodate the fixtures 100. The third fin 26 and the fourth fin 28 adjoin with each other and are inserted between and snap with the first fins 22 at one side of the second fins 24.

The first fins 22 each have a first plate 220 and two flanges 222 respectively extending perpendicularly from upper and lower edges of the first plate 220. The upper flange 222 of the first fin 22 is provided with two spaced locking parts thereon. The locking parts each include a locking hole 2220 and a locking patch 23. The locking hole 2220 is substantially inverted T-shaped and surrounded by a frame which has a front portion thereof projecting outwardly from the flange 222. The locking patch 2222 is located at a side of the locking hole 2220 and vertically extends from the upper edge of the first plate 220. In the fin unit 20, the locking patch 2222 of each of the first fins 22 is received engagingly in a front portion of the locking hole 2220 of a rear first fin 22.

The second fins 24 each have a second plate 240 and two flanges 242 extending perpendicularly from upper and lower edges of the second plate 240 respectively. The upper one of the flanges 242 of each second fin 24 is provided with two spaced locking parts identical and corresponding to those of the first fins 22. The locking part comprises an inverted T-shaped locking hole 2420 and a locking patch 2422 extending upwardly from the upper edge of the second plate 240 and located at a side of the locking hole 2420.

Figure 4:
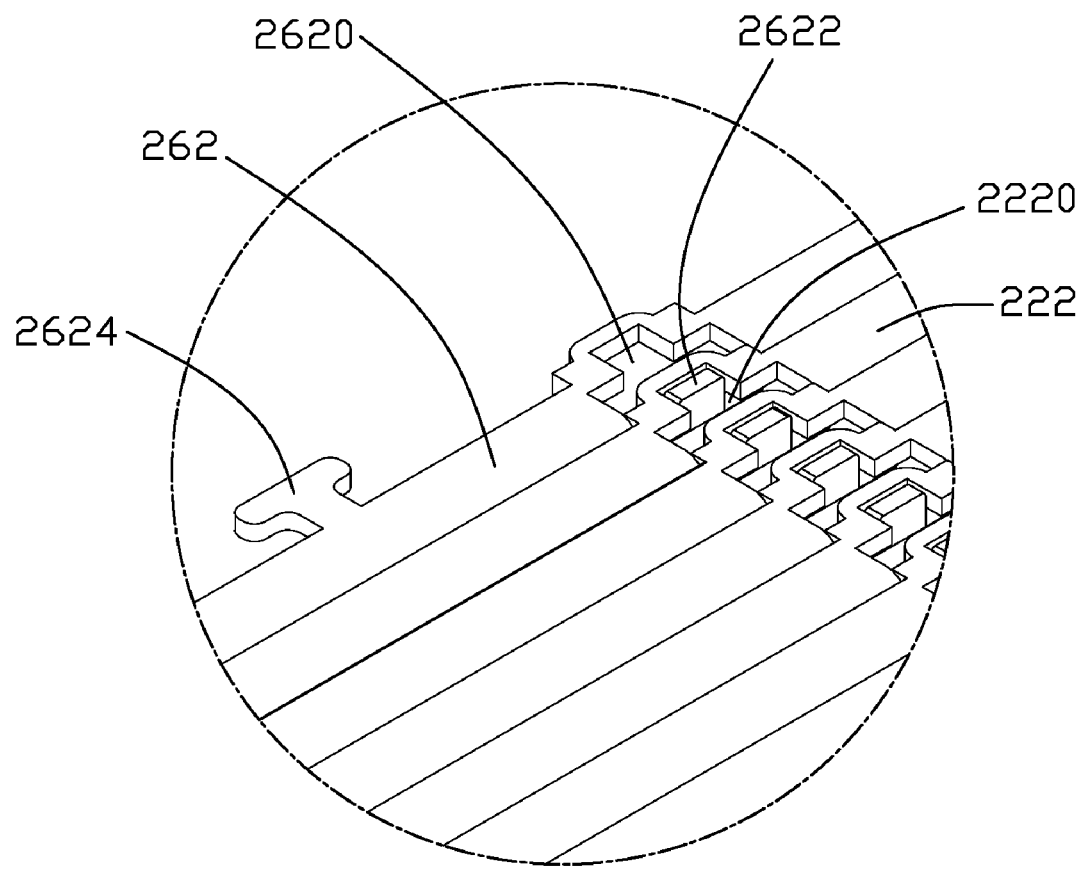
FIG. 4 is an enlarged view of a portion circled by line IV of FIG. 3.

The third fin 26 is similar to the first fins 22 and comprises a third plate 260 and two flanges 262 extending from upper and lower edges of the third plate 260, respectively. The upper one of the flanges 262 is provided with two locking parts, which are identical and corresponding to those of the first fins 22. The locking part comprises an inverted T-shaped locking hole 2620 and a locking patch 2622 extending upwardly from the upper edge of the third plate 260 and located at a side of the locking hole 2620. As shown in FIG. 4, the upper one of the flanges 262 of the third fin 26 is further provided with two spaced engaging parts thereon. The engaging part is a catch 2624 protruding horizontally from an edge of the upper flange 262. The catch 2624 is substantially gradually expanding from a joint with the flange 262 to a distal end remote from the flange 262. In this embodiment, the catch 2624 is designed to be a T-shaped flake.

Figure 5:
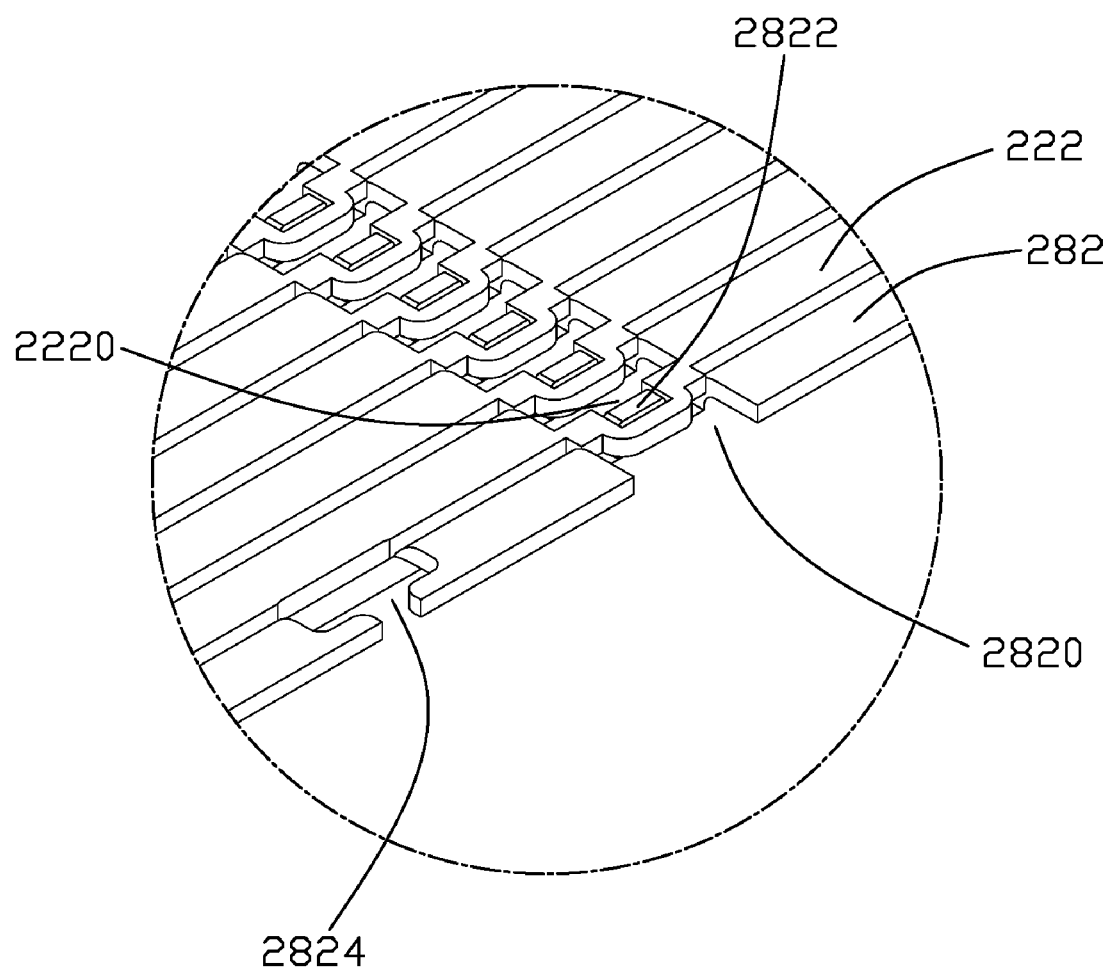
FIG. 5 is an enlarged view of a portion circled by line V of FIG. 3.

The fourth fin 28 is similar to the first fins 22 and comprises a fourth plate 280 and two flanges 282 extending from upper and lower edges of the fourth plate 280, respectively. The upper one of the flanges 282 is provided with two locking parts thereon. The locking part comprises an opening 2820 for receiving the front portion of the frame projecting from the flange 262 of the third fin 26, and a latching patch 2822 identical to that of the first fins 22. As shown in FIG. 5, the upper one of the flanges 282 is also provided with two engaging parts corresponding to those of the third fin 26. The engaging part of the fourth fin 28 is an engaging hole 2824 matching with the catch 2624 of the third fin 26. The engaging hole 2824 is concaved from an edge of the upper one of the flanges 282 and substantially T-shaped in complementary with the catch 2624 of the third fin 26.

In assembly of the fin unit 20, the third fin 26 and the fourth fin 28 are combined together with their flanges 262, 282 facing to each other, and the catch 2624 of the third fin 26 is received engagingly in the engaging hole 2824 of the fourth fin 28. The third fin 26 and the fourth fin 28 respectively assemble with adjacent ones of the first fins 22 at the two sides thereof by the locking patches 2622, 2822 of the third, fourth fins 26, 28 being received engagingly in the locking holes 2220 of the adjacent first fins 22. Some of the first fins 22 are assembled to the first fins 22 that are engaged with the third fin 26 and the fourth fin 28, by their locking parts thereof engaging with each other in succession, and their flanges 222 are always oriented in a direction consistent with the corresponding third fin 26 or the fourth fin 28. With respect to the second fins 24, which work the same way as the first fins 22, are assembled with the first fins 22 connected with the third fin 26 by the locking patches 2222, 2422 being engaged in corresponding locking holes 2420 of the second fins 24. The remainder of the first fins 22 are assembled to an outermost one of the second fins 24 in a similar way that the second fins 24 are assembled to the first fins 22 to complete the fin unit 20.

In other words, the fin unit 20 is provided with two fins sets: the first fin set and the second fin set. The first fin set and the second fin set each have a plurality of fins assembled with their flanges in a same orientation. The first fin set has the third fin 26 at an outmost position with its flange directing outwardly and nakedly; the second fin set has the fourth fin 28 at an outmost position with its flange directing outwardly and nakedly. The fins of the first fin set have the flanges and the frames of the locking parts thereof extending towards the flanges and the frames of the locking parts of the fins of the second fin set, and vice versa. The two fin sets are assembled by the third fin 26 of the first fin set engaging with the fourth fin 28 of the second fin set. The fin unit 20 has a top surface formed by the upper flanges of the fins and a bottom surface formed by the lower flanges of the fins. Therefore, all the frames of the locking parts and the flanges of the fins are located between two outmost fins of the fin unit 20, without naked outwardly extending flanges. Thus the heat sink in accordance with the present invention does not have a fin which has a flange with a sharp edge exposed outward, whereby the danger of cutting an operator's hands when handling the heat sink can be avoided. The bottom surface is attached to the top surface of the base 10 by soldering. Thus, in use, heat generated by the heat-generating component can be adsorbed by the base 10 and then transferred to the fin unit 20 to be dissipated into ambient. As the fin unit 20 has no frame of the locking part and flanges of the fins is bared outwardly, the heat sink eliminates a risk of damaging surrounding components and hurting operator during installation.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink adapted for removing heat from a heat-generating component, comprising:

a first fin set comprising a plurality of fins, each of the fins having a flange extending perpendicularly from an edge thereof and oriented in a first direction, the flanges engaging with each other in succession through locking parts formed thereon; and a second fin set comprising a plurality of fins, each of the fins of the second fin set having a flange extending perpendicularly from an edge thereof toward the first fin set and oriented in a second direction opposite to the first direction, the flanges engaging with each other in succession through locking parts formed thereon;

wherein one of the flanges of an outmost one of the fins of the first fin set and one of the flanges of an outmost one of the fins of the second fin set are extended toward each other and engaged with each other;

wherein the flanges of the outmost ones of the fins of the first fin set and second fin set are provided with corresponding engaging parts matching with each other;

wherein the engaging part of the outmost one of the fins of the first fin set is a catch protruding horizontally form an edge of the flange of the outmost one of the fins of the first fin set, the engaging part of the outmost one of the fins of the second fin set is an engaging hole complementary with the catch; and wherein the catch of the outmost one of the fins of the first fin set is a T-shaped flake, the engaging hole of the outmost one of the fins of the second fin set is a T-shaped recess from the edge of the flange of the outmost one of the fins of the second fin set.

2. The heat sink as claimed in claim 1, wherein the locking parts of the fins of the first fin set and the second fin set each comprise an inverted T-shaped locking hole and a locking patch located aside the locking hole and vertically extends from the edge of the each fin.

3. The heat sink as claimed in claim 2, wherein the locking patch of each of the fins of the first fin set is received engagingly in the locking hole of a rear one of the fins of the first fin set.

4. The heat sink as claimed in claim 3, wherein the locking patch of each of the fins of the second fin set is received engagingly in the locking hole of a front one of the fins of the second fin set.

5. The heat sink as claimed in claim 4, wherein the locking part of the outmost one of the fins of the second fin set comprises an opening receiving the locking part of the outmost one of the fins of the first fin set.

6. A heat sink, comprising:
a plurality of first fins, each of the first fins having a flange extending perpendicularly from an edge thereof and oriented in a same direction, the flanges engaging with each other in succession through locking parts formed thereon, wherein middle ones of the first fins have shorter length to constitute a plurality of second fins so that two recesses are defined besides two sides of the second fins, respectively;
a third fin having a flange extending perpendicularly from an edge thereof, the flange of the third fin forming a locking part engaging with the locking part of an adjacent one the first fins and an engaging part; and
a fourth fin having a flange extending perpendicularly from an edge thereof, the flange of the fourth fin forming an engaging part matching with the engaging part of the third fin;
wherein the flanges of the third fin and the fourth fin face to and engage with each other by their engaging parts, the first fins are fixed to the third fin by the locking parts of the third fin and the adjacent one of the first fins and have their flanges oriented in a direction the same as the extending direction of the flange of the third fin;
wherein the engaging part of the third fin is a catch protruding horizontally form an edge of the flange of the third fin, the engaging part of the fourth fin set is an engaging hole complementary with the catch; and
wherein the catch of the third fin is a T-shaped flake, the engaging hole of the fourth fin is a T-shaped recess from the edge of the flange of the fourth fin.

7. The heat sink as claimed in claim 6, wherein the locking part of each of the first fins comprises an inverted T-shaped locking hole and a locking patch located aside the locking hole and vertically extends from the edge of the each of the first fins.

8. The heat sink as claimed in claim 7, wherein the locking patch of each of the first fins is received engagingly in the locking hole of a rear one of the first fins.

9. The heat sink as claimed in claim 8, wherein one of the third fin and the fourth fin has the locking part thereof defining an opening, the other of the third fin and the fourth fin has the locking part thereof forming a frame engaged in the opening.

10. The heat sink as claimed in claim 9, wherein the locking part of the third fin forms a locking patch engagingly received in the locking hole of the adjacent one of the first fins.

11. The heat sink as claimed in claim 6, wherein the flange of the fourth fin forms a locking part similar to the locking part of each of the first fins.

12. The heat sink as claimed in claim 11, further comprising a plurality of additional fins each having a structure similar to that of each of the first fins and having a locking part engaging with each other in succession, wherein one of the additional fins adjacent to the fourth fin engages in the locking part of the fourth fin and wherein flanges of the additional fins extend in a direction the same as that of the flange of the fourth fin toward the third fin and the first fins.

* * * * *